(12) United States Patent
Mou et al.

(10) Patent No.: US 11,668,294 B2
(45) Date of Patent: Jun. 6, 2023

(54) THIN GAS TRANSPORTATION DEVICE

(71) Applicant: MICROJET TECHNOLOGY CO., LTD., Hsinchu (TW)

(72) Inventors: Hao-Jan Mou, Hsinchu (TW); Chung-Wei Kao, Hsinchu (TW); Shih-Chang Chen, Hsinchu (TW); Hung-Hsin Liao, Hsinchu (TW); Yung-Lung Han, Hsinchu (TW); Chi-Feng Huang, Hsinchu (TW); Chun-Yi Kuo, Hsinchu (TW)

(73) Assignee: MICROJET TECHNOLOGY CO., LTD., Hsinchu (TW)

( * ) Notice: Subject to any disclaimer, the term of this patent is extended or adjusted under 35 U.S.C. 154(b) by 205 days.

(21) Appl. No.: 17/168,340

(22) Filed: Feb. 5, 2021

(65) Prior Publication Data
US 2021/0254613 A1 Aug. 19, 2021

(30) Foreign Application Priority Data
Feb. 18, 2020 (TW) .................................. 109105223

(51) Int. Cl.
*F16K 99/00* (2006.01)
*F04B 43/04* (2006.01)
*F16K 17/04* (2006.01)

(52) U.S. Cl.
CPC ........ *F04B 43/046* (2013.01); *F16K 17/0493* (2013.01); *F16K 99/0015* (2013.01); *H10N 30/2047* (2023.02)

(58) Field of Classification Search
CPC ............. F16K 17/0493; F16K 99/0015; F16K 99/0057; F04B 43/046; F04B 45/047; H01L 41/0475; H01L 41/0973
See application file for complete search history.

(56) References Cited

U.S. PATENT DOCUMENTS

| 9,989,047 | B2* | 6/2018 | Chen ................. F04B 45/047 |
| 10,451,051 | B2* | 10/2019 | Chen ................. F04B 53/10 |
| 10,487,820 | B2* | 11/2019 | Chen ................. F04B 39/1066 |
| 10,775,276 | B2 | 9/2020 | Mou et al. |

(Continued)

FOREIGN PATENT DOCUMENTS

| CN | 102046978 A | 5/2011 |
| CN | 107023456 A | 8/2017 |
| TW | 202001212 A | 1/2020 |

*Primary Examiner* — Matthew W Jellett
(74) *Attorney, Agent, or Firm* — McClure, Qualey & Rodack, LLP

(57) ABSTRACT

A thin gas transportation device includes an inlet plate, a resonance sheet, an actuating element, a first insulation frame attached to the actuating element, a conductive frame, and a second insulation frame attached to the conductive frame. The conductive frame has a conductive outer frame attached to the first insulation frame, an elastic conductive pin, and a conductive piece connected to an outer edge portion of the conductive outer frame. One end of the elastic conductive pin is connected to an inner edge portion of the conductive outer frame, and the other end of the elastic conductive pin extends obliquely toward the actuating element and forms a bent portion. The bent portion presses against the actuating element and is electrically connected to the actuating element, and the bent portion is strip-shaped.

21 Claims, 14 Drawing Sheets

(56) References Cited

U.S. PATENT DOCUMENTS

| | | | |
|---|---|---|---|
| 11,525,439 B2* | 12/2022 | Mou | F04B 49/03 |
| 2014/0377099 A1* | 12/2014 | Hsueh | F04B 49/22 |
| | | | 417/413.2 |
| 2017/0215744 A1* | 8/2017 | Kawamura | A61B 5/0235 |
| 2017/0218936 A1* | 8/2017 | Chen | F16K 99/0015 |
| 2018/0368704 A1* | 12/2018 | Kawamura | F16K 7/00 |
| 2021/0275041 A1* | 9/2021 | Mou | A61B 5/0225 |

* cited by examiner

THIN GAS TRANSPORTATION DEVICE

CROSS-REFERENCE TO RELATED APPLICATION

This non-provisional application claims priority under 35 U.S.C. § 119(a) to Patent Application No. 109105223 filed in Taiwan, R.O.C. on Feb. 18, 2020, the entire contents of which are hereby incorporated by reference.

BACKGROUND

Technical Field

The present disclosure relates to a thin gas transportation device, more particularly, to a thin gas transportation device where an elastic conductive pin and an actuator are electrically connected to each other through contacting.

Related Art

With the rapid developments of technology, the application of fluid transport devices becomes more and more diversified, and can be seen in the applications of industrial, biomedical, medical cares, electronic heat dissipation devices, etc., and even in wearable devices, which attracts a lot of attention recently. Thus, it can be understood that there is a trend that the sizes of traditional gas transportation devices have gradually become smaller and the fluid transporting capacities of the gas transportation devices have become larger. Thereby, the demand of thin gas transportation devices began to arise.

The existing gas transportation device applies a high-frequency driving voltage to an actuator inside the thin gas transportation device, and transports the gas by the rapid vibration of the actuator owing to the piezoelectric effect. The actuator not only receives a driving voltage through the conductive pin of itself, but also receives a reverse driving voltage through the conductive frame electrically connected to the actuator. One of the existing conductive frames 1 shown in FIG. 1 includes a conductive frame 11, at least a transmission portion 12, at least a conductive contact 13, and a conductive piece 14. The conductive contact 13 is disposed in the conductive frame 11 and is used to be electrically connected to the actuator (not shown). The transmission portion 12 is connected between the conductive frame 11 and the conductive contact 13. The conductive piece 14 is connected to the conductive frame 11 and is used to receive the aforementioned driving voltage, so that the driving voltage is transmitted to the conductive contact 13 through the conductive frame 11 and the transmission portion 12, and transmitted to the actuator by the conductive contact 13 at last. However, the electrical impedance of the existing conductive frame 1 is too high, which decreases the transmission efficiency of the driving voltage. In addition, in the current conductive frame 1, the number of the conductive contacts 13 is four and the four conductive contacts 13 are respectively connected to the actuator. As a result, due to slight differences in resistances between the conductive contacts 13 and the conductive contacts 13 would be drawn by the conductive piece 14, thus the electrical connections between the conductive contacts 13 and the actuator would be interfered during the vibration of the device. Moreover, the conductive contacts 13 and the actuator are electrically connected to each other in a point contact manner, and the contact area for point contact is small. As a result, during the repeated vibration under high frequency of the actuator, the contact areas suffer relatively serious abrasion, thus decreasing the lifespan of the device. This is indeed a problem urgently to be solved in the related technical field.

SUMMARY

One object of the present disclosure is providing a thin gas transportation device which uses a conductive frame having a conductive pin to solve the problems such as fast abrasion and high electrical resistance.

To achieve the above mentioned purpose(s), a general embodiment of the present disclosure provides a thin gas transportation device. The thin gas transportation device includes an inlet plate, a resonance sheet, an actuating element, a first insulation frame attached to the actuating element, a conductive frame, and a second insulation frame attached to the conductive frame. The inlet plate has a first surface, a second surface opposite to the first surface, a plurality of inlet holes respectively penetrating from the first surface to the second surface, a convergence chamber recessed from the second surface and positioned at a center portion of the second surface, and a plurality of inlet channels recessed from the second surface. One end for each of the plurality of inlet channels is connected to a corresponding inlet hole of the plurality of inlet holes, and the other end for each of the plurality of inlet channels is connected to the convergence chamber. The resonance sheet is attached to the second surface and includes a central perforation disposed at a center portion of the resonance sheet, a vibration portion disposed around the central perforation corresponding to the convergence chamber, and a fixed portion disposed around the vibration portion at the outer periphery of the resonance sheet. The resonance sheet is attached to the inlet plate through the fixed portion. The actuating element is attached to the fixed portion of the resonance sheet. The conductive frame has a conductive outer frame attached to the first insulation frame, an elastic conductive pin, and a conductive piece connected to an outer edge portion of the conductive outer frame. One end of the elastic conductive pin is connected to an inner edge portion of the conductive outer frame, and the other end of the elastic conductive pin extends obliquely toward the actuating element and forms a bent portion. The bent portion presses against the actuating element and is electrically connected to the actuating element, and the bent portion is strip-shaped.

BRIEF DESCRIPTION OF THE DRAWINGS

The disclosure will become more fully understood from the detailed description given herein below for illustration only, and thus not limitative of the disclosure, wherein.

DETAILED DESCRIPTION

The present disclosure will now be described more specifically with reference to the following embodiments. It is to be noted that the following descriptions of different embodiments of this disclosure are presented herein for purpose of illustration and description only, and it is not intended to limit the scope of the present disclosure.

Figure 1:
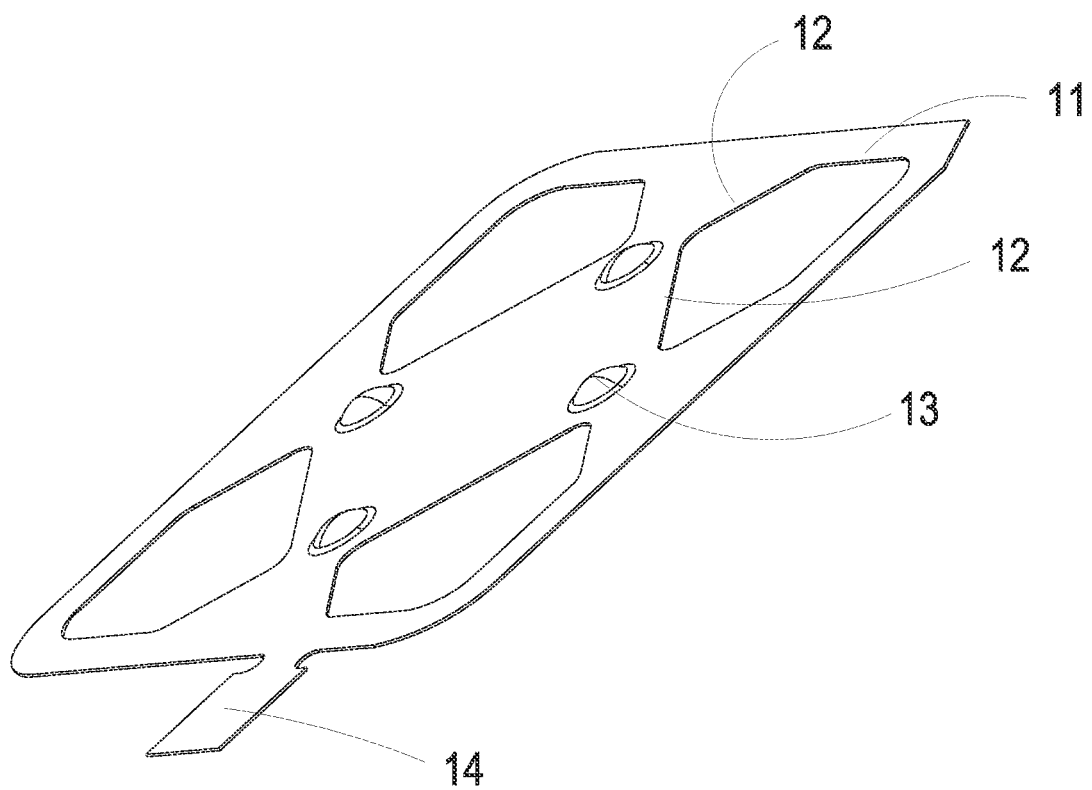
FIG. 1 illustrates a perspective view of a conductive frame in the prior art.
Figure 2A:
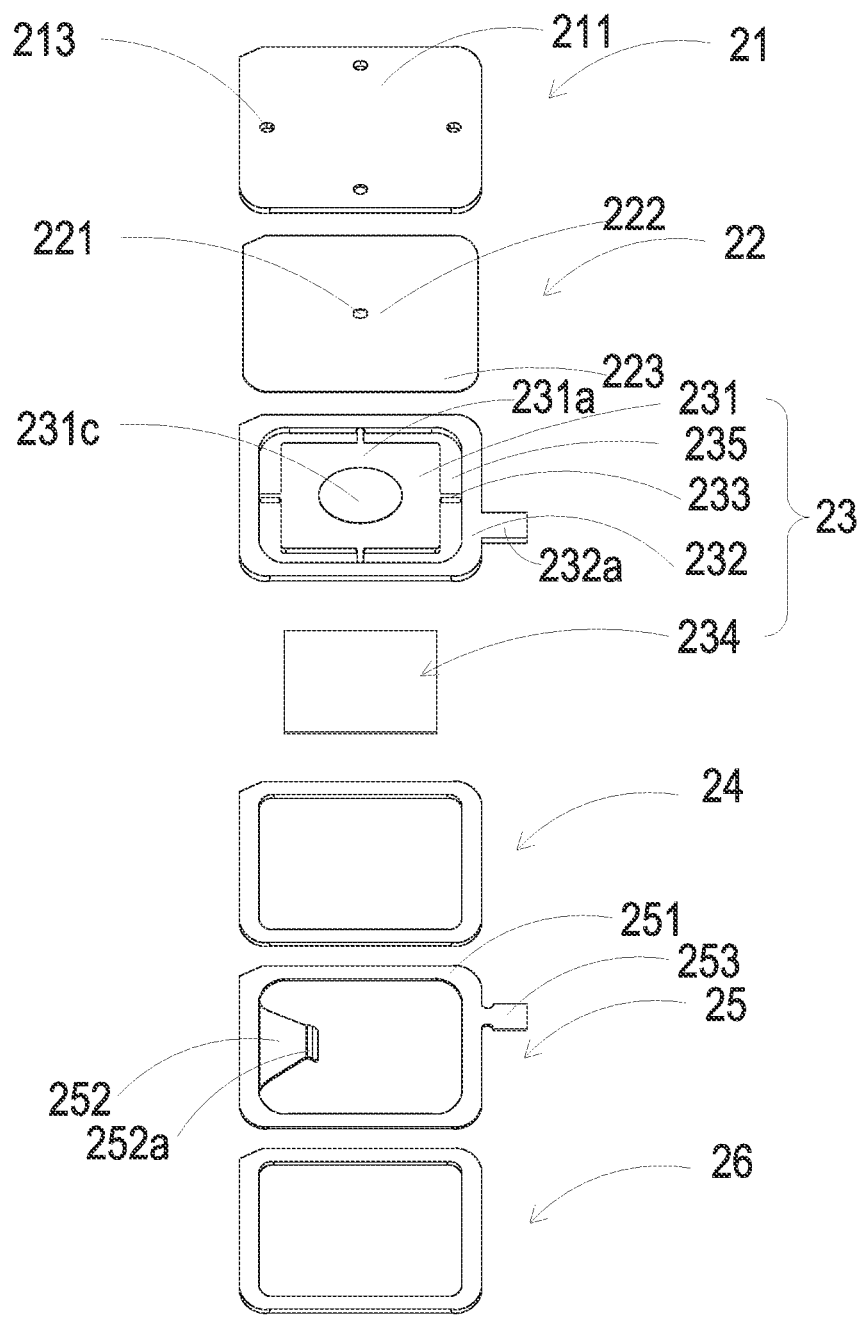
FIG. 2A illustrates a front exploded view of a thin gas transportation device according to an exemplary embodiment of the present disclosure.
Figure 2B:
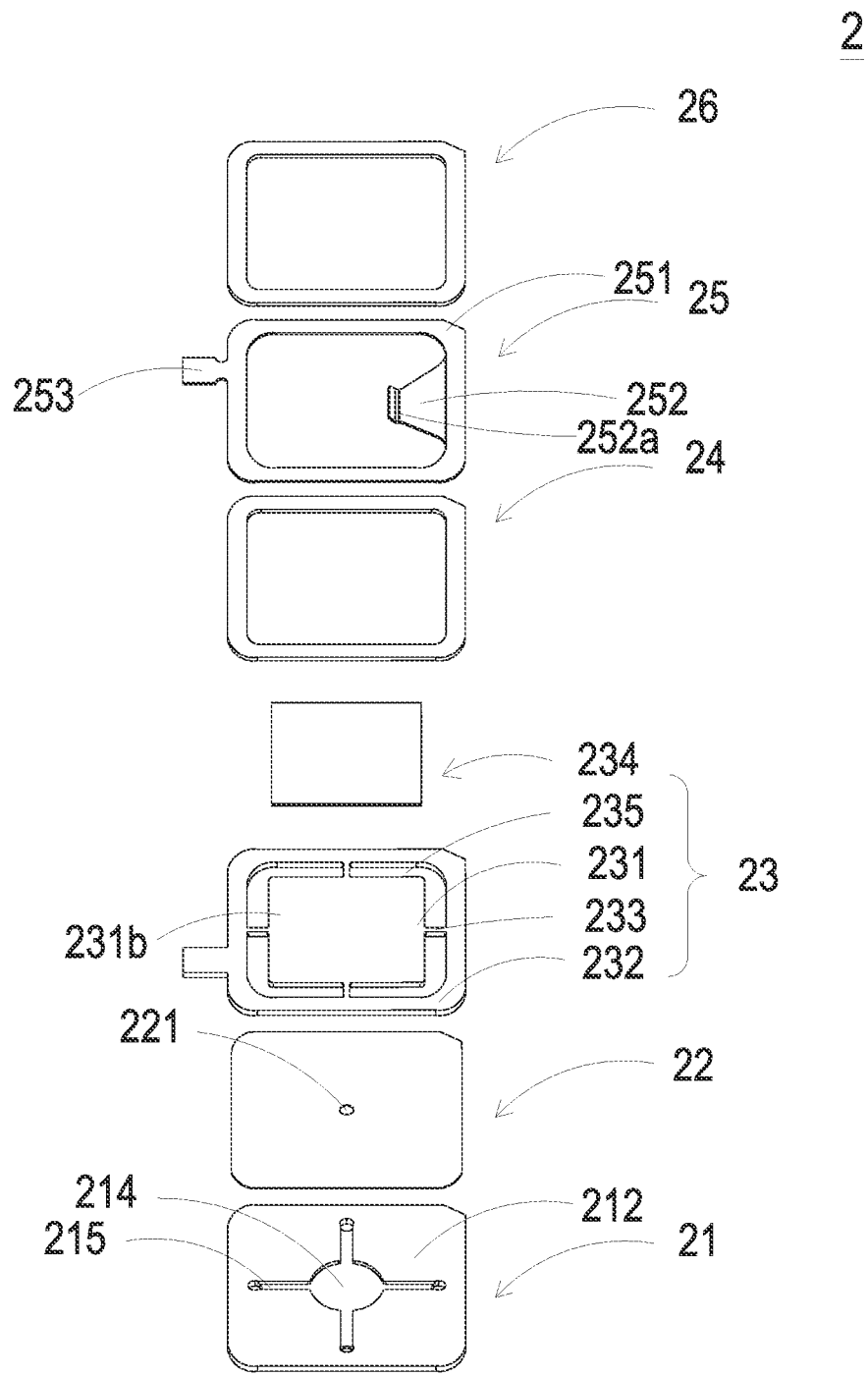
FIG. 2B illustrates a rear exploded view of the thin gas transportation device according to the exemplary embodiment of the present disclosure.

Please refer to FIG. 2A and FIG. 2B. FIG. 2A illustrates a front exploded view of a thin gas transportation device 2 according to an exemplary embodiment of the present disclosure. FIG. 2B illustrates a rear exploded view of the thin gas transportation device 2 of the exemplary embodiment. The thin gas transportation device 2 includes an inlet plate 21, a resonance sheet 22, an actuating element 23, a first insulation frame 24, a conductive frame 25, and a second insulation frame 26.

The inlet plate 21 has a first surface 211, a second surface 212, a plurality of inlet holes 213, a convergence chamber 214, and a plurality of inlet channels 215. The first surface 211 and the second surface 212 are two surfaces opposite to each other. In this embodiment, the number of the inlet holes 213 is four, but is not limited thereto. The inlet holes 213 respectively penetrate the inlet plate 21 from the first surface 211 to the second surface 212. The second surface 212 is recessed to form the convergence chamber 214, and the convergence chamber 214 is located at a center portion of the second surface 212. The number of the inlet channels 215 corresponds to the number of the inlet holes 213, so the number of the inlet channels 215 is also four in this embodiment. One end of each of the inlet channels 215 is connected to a corresponding inlet hole 213, and the other end of each of the inlet channels 215 is connected to the convergence chamber 214. Thereby, after the gas enters into the thin gas transportation device 2 from the inlet holes 213, the gas will pass through the corresponding inlet channels 215, and then converge in the convergence chamber 214.

The resonance sheet 22 is attached to the second surface 212 of the inlet plate 21. The resonance sheet 22 includes a central perforation 221, a vibration portion 222, and a fixed portion 223. The central perforation 221 is disposed at a center portion of the resonance sheet 22 and penetrates the resonance sheet 22. The vibration portion 222 is disposed around the central perforation 221, and the fixed portion 223 is disposed around the vibration portion 222. The resonance sheet 22 is attached to the inlet plate 21 through the fixed portion 223. The central perforation 221 and the vibration portion 222 are perpendicularly corresponding to the convergence chamber 214 of the inlet plate 21 when the resonance sheet 22 is attached to the inlet plate 21.

The actuating element 23 is attached to the resonance sheet 22. The actuating element 23 includes a vibration plate 231, a frame 232, a plurality of connection portions 233, a piezoelectric sheet 234, and a plurality of gas channels 235. In this embodiment, the vibration plate 231 has a square shape, and the frame 232 is a square frame disposed around the periphery of the vibration plate 231. The frame 232 has a conductive pin 232a extending horizontally from the outer edge of the frame 232. The gas channels 235 are formed between the vibration plate 231, the frame 232, and the plurality of connection portions 233. The actuating element 23 attached to the fixed portion 223 of the resonance sheet 22 through the frame 232. The number of the connection portions 233 in this embodiment is four, but is not limited thereto. The connection portions 233 are respectively connected between the vibration plate 231 and the frame 232 to provide a flexible support for the vibration plate 231. The shape and the area of the piezoelectric sheet 234 respectively are corresponding to the shape and the area of the vibration plate 231. In this embodiment, the piezoelectric sheet 234 also has a square shape, and the side length of the piezoelectric sheet 234 may be smaller than or the same as the side length of the vibration plate 231. The piezoelectric sheet 234 is attached to the vibration plate 231. Moreover, the vibration plate 231 has two opposite surfaces: an upper surface 231a and a lower surface 231b. The upper surface 231a has a protruding portion 231c, and the piezoelectric sheet 234 is attached to the lower surface 231b.

Figure 3A:
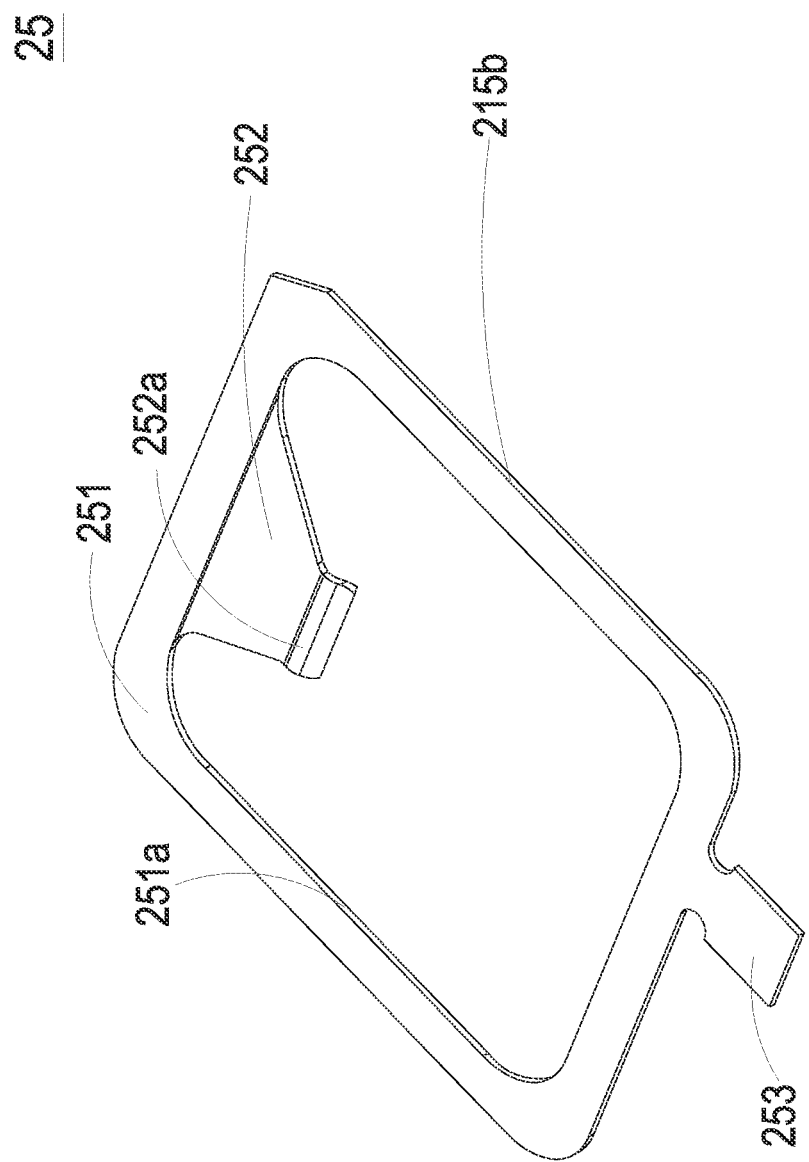
FIG. 3A illustrates a schematic perspective view of the conductive frame of the exemplary embodiment.
Figure 3B:
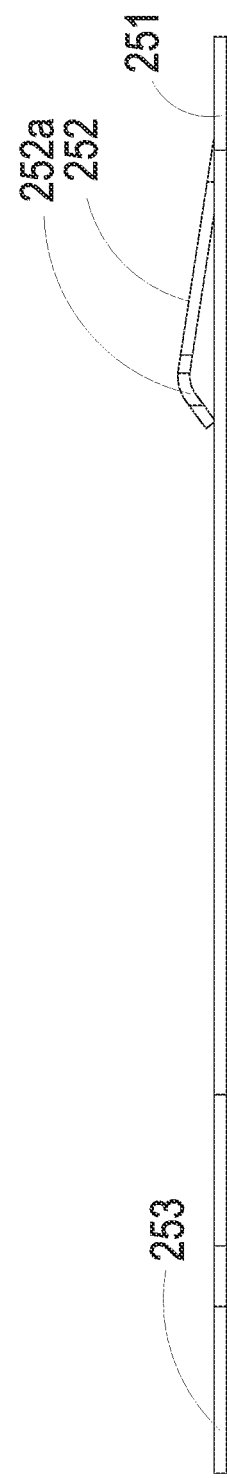
FIG. 3B illustrates a schematic side view of the conductive frame of the exemplary embodiment.

The first insulation frame 24 and the second insulation frame 26 have the same shape with the frame 232 of the actuating element 23. In this embodiment, they are all square frames. Please refer to FIG. 2A, FIG. 3A, and FIG. 3B at the same time. The conductive frame 25 includes a conductive frame 251, an elastic conductive pin 252, and a conductive piece 253. The conductive frame 251 has the same shape with the first insulation frame 24 and the second insulation frame 26, which is a square frame as well. One end of the elastic conductive pin 252 is connected to an inner edge portion 251a of the conductive outer frame 251, and the other end of the elastic conductive pin 252 extends obliquely toward the actuating element 23 and forms a bent portion 252a. The width of the elastic conductive pin 252 gradually shrinks from the inner edge portion 251a of the conductive outer frame 251 where the elastic conductive pin 252 is connected to the bent portion 252a. The bent portion 252a presses against the piezoelectric sheet 234 of the actuating element 23 and thus is electrically connected to the piezoelectric sheet 234. The bent portion 252a is strip-shaped, so that the shape of the contacting area between the bent portion 252a and the piezoelectric sheet 234 is also a strip rather than a point. The conductive piece 253 is connected to an outer edge portion 251b of the conductive outer frame 251. Furthermore, the elastic conductive pin 252 is disposed away from the conductive piece 253.

The aforementioned elastic conductive pin 252 has elasticity and conductivity. In order to closely press against the actuating element 23, the bent portion 252a of the elastic conductive pin 252 is higher than the conductive outer frame 251 by an abutting distance. The abutting distance may be between 0.05 mm and 0.5 mm, so that the bent portion 252a can press against the piezoelectric sheet 234 of the actuating element 23 more closely. Thus, when the piezoelectric sheet 234 drives the vibration plate 231 to vibrate, the bent portion 252a still can press against the piezoelectric sheet 234, thereby keeping the electrical connection between the piezoelectric sheet 234 and the vibration plate 231. In addition, by connecting the vibration plate 231 to the piezoelectric sheet 234 through contacting, a soldering process can be omitted, thus also preventing from initiating an electric arc at the interface between the components. Moreover, the bent portion 252a of the elastic conductive pin 252 makes the contact area thereof between the elastic conductive pin 252 and the piezoelectric sheet 234 is constituted of a curved surface, thereby avoiding excessive contact generated between burrs or a sharp corner at the end of the elastic conductive pin 252 and the piezoelectric sheet 234 during vibration, which results in not only problems such as faster abrasion, noise production, but also the concern about lifespan reduction. Similarly, the strip shape of the bent portion 252a can also increase the contact area with the piezoelectric sheet 234, thereby avoiding excessive abrasion. Increasing the contact area between the vibration plate 231 and the piezoelectric sheet 234 can also reduce electrical impedance between the components for providing better conductivity. Furthermore, the arrangement that the elastic conductive pin 252 is disposed away from the conductive piece 253 can prevent the conductive piece 253 from being interfered by the elastic conductive pin 252 when the actuating element 23 vibrates. Conductive coating with lubricating and conducting effect may be filled or coated between the elastic conductive pin 252 and the piezoelectric sheet 234 so as to improve the contact reliability.

Figure 4A:
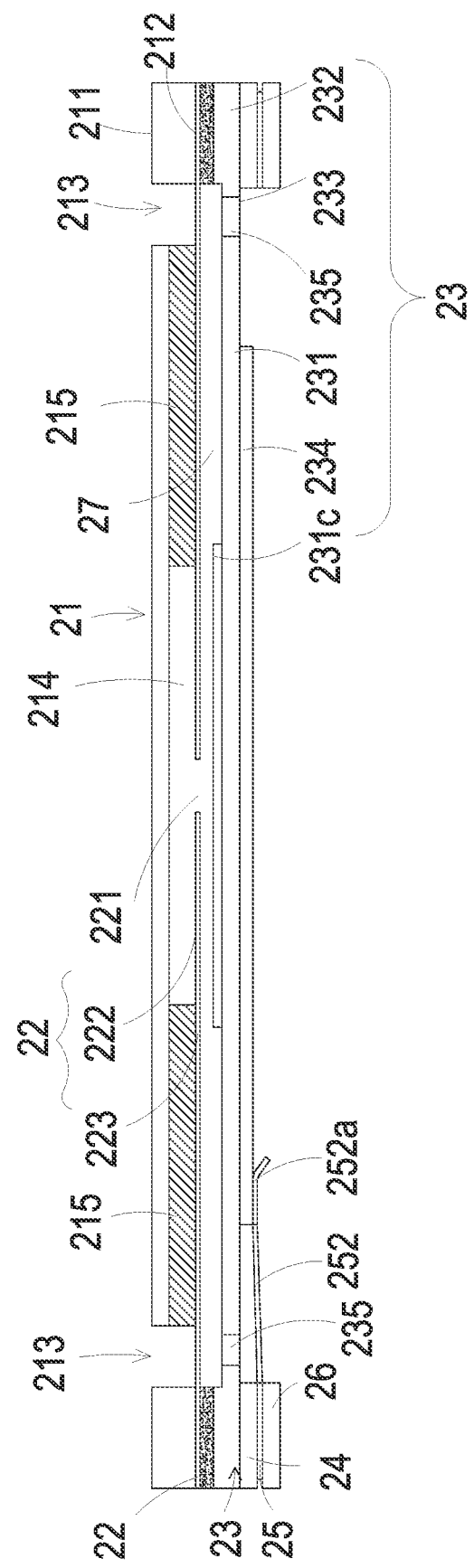
FIG. 4A illustrates a schematic cross-sectional view of the thin gas transportation device according to the exemplary embodiment of the present disclosure.

Please refer to FIG. 2A and FIG. 4A. FIG. 4A illustrates a schematic cross-sectional view of the thin gas transportation device 2. The inlet plate 21, the resonance sheet 22, the actuating element 23, the first insulation frame 24, the conductive frame 25, and the second insulation frame 26 are sequentially stacked and assembled with each other. A vibration chamber 27 is formed between the resonance sheet 22 and the vibration plate 231. Moreover, the bent portion 252a of the elastic conductive pin 252 of the conductive frame 25 presses against the piezoelectric sheet 234 of the actuating element 23 and thus is electrically connected to the piezoelectric sheet 234. Therefore, the conductive pin 232a of the actuating element 23 and the conductive piece 253 of the conductive frame 25 can receive external drive signals (including drive voltage and drive frequency) and transmit the drive signals to the piezoelectric sheet 234.

Figure 4B:
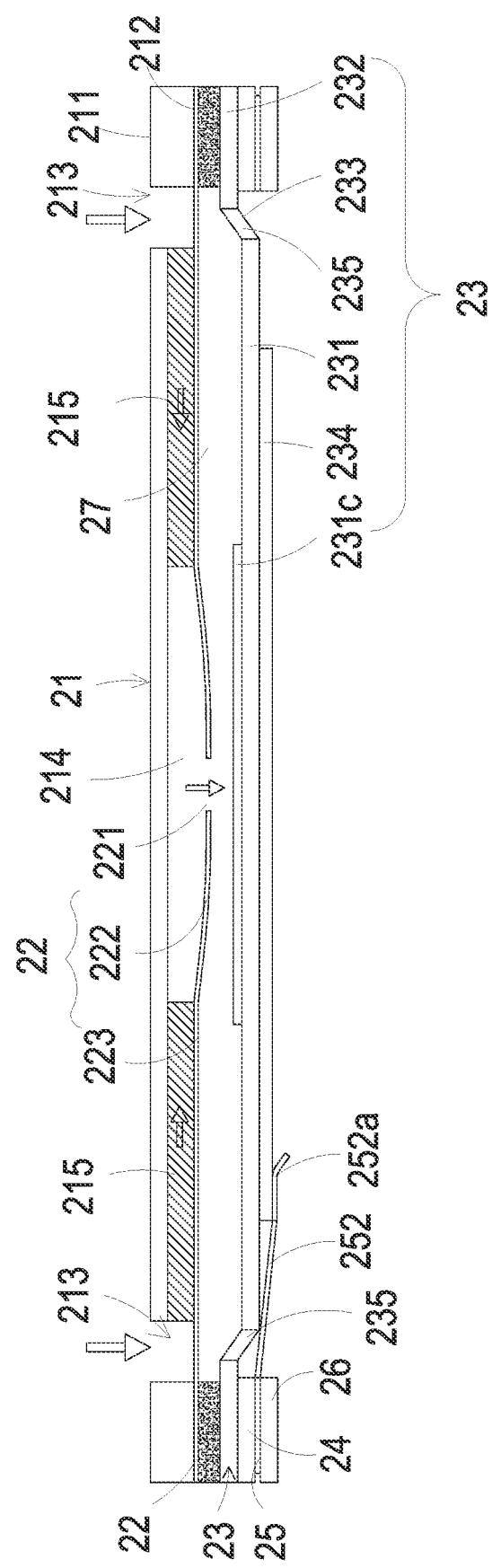
FIG. 4B to FIG. 4D illustrate schematic cross-sectional views showing the thin gas transportation device according to the exemplary embodiment of the present disclosure at different operation steps.
Figure 4C:
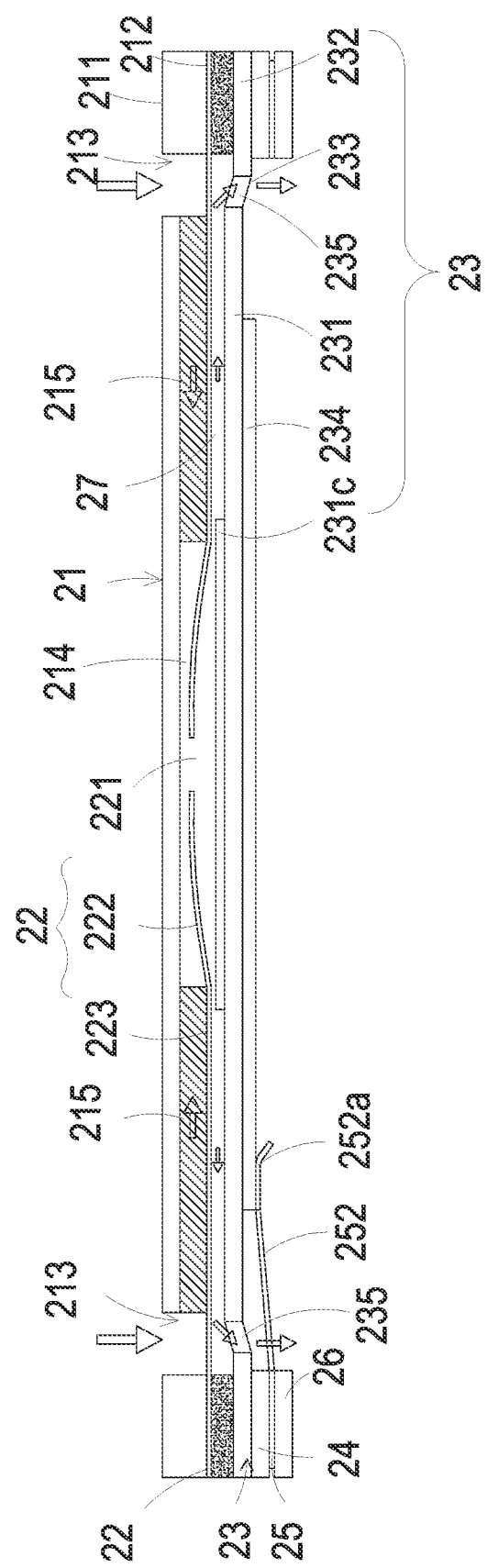
Figure 4D:
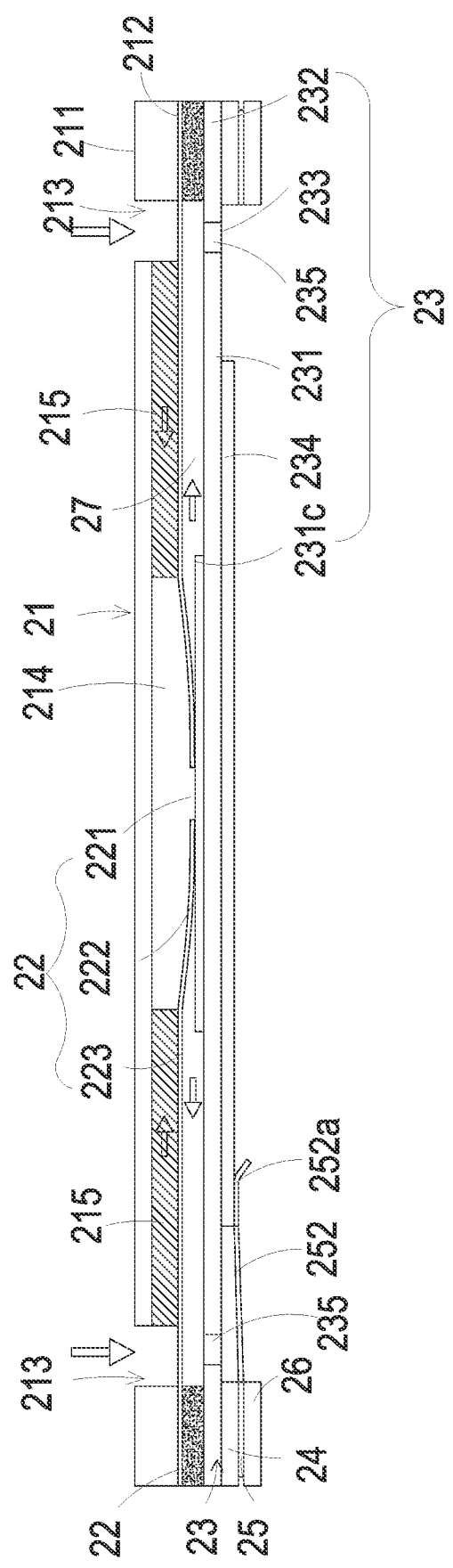

Please refer to FIG. 4B to FIG. 4D for the operation of the thin gas transportation device 2. When the piezoelectric sheet 234 receives the diving signal, the piezoelectric sheet 234 starts to deform owing to the piezoelectric effect, and thus drives the vibration plate 231 to move upwardly and downwardly. Please refer to FIG. 4B first, when the vibration plate 231 moves downwardly, the vibration plate 23 drives the vibration portion 222 of the vibration sheet 22 to move downwardly as well. Thus, the volume of the convergence chamber 214 increases, thereby drawing the external gas into the convergence chamber 214 through the inlet holes 213 and the inlet channels 215. Afterwards, as shown in FIG. 4C, when the vibration plate 231 is driven to move upwardly, the gas in the vibration chamber 27 is pushed to move from the center portion toward the peripheral portion, and then the gas is pushed into the gas channels 235 for being discharged out downwardly. At the same time, the resonance sheet 22 will move upwardly and push the gas inside the convergence chamber 214 downwards through the central perforation 221. Then, as shown in FIG. 4D, when the vibration plate 231 moves downwardly and backs to its original position, the vibration plate 231 drives the vibration portion 222 of the resonance sheet 22 to move downwardly. Thus, the vibration portion 222 moves toward the protruding portion 231c of the vibration plate 231, and the gas inside the vibration chamber 27 is pushed continuously outside of the thin gas transportation device 2. Moreover, since the vibration portion 222 moves downwardly, the volume of the convergence chamber 214 is increased greatly, so that the gas outside the thin gas transportation device 2 can be drawn into the convergence chamber 214 through the inlet holes 213 and the inlet channels 215. By repeating the aforementioned steps, the gas transportation process can be accomplished.

Figure 5A:
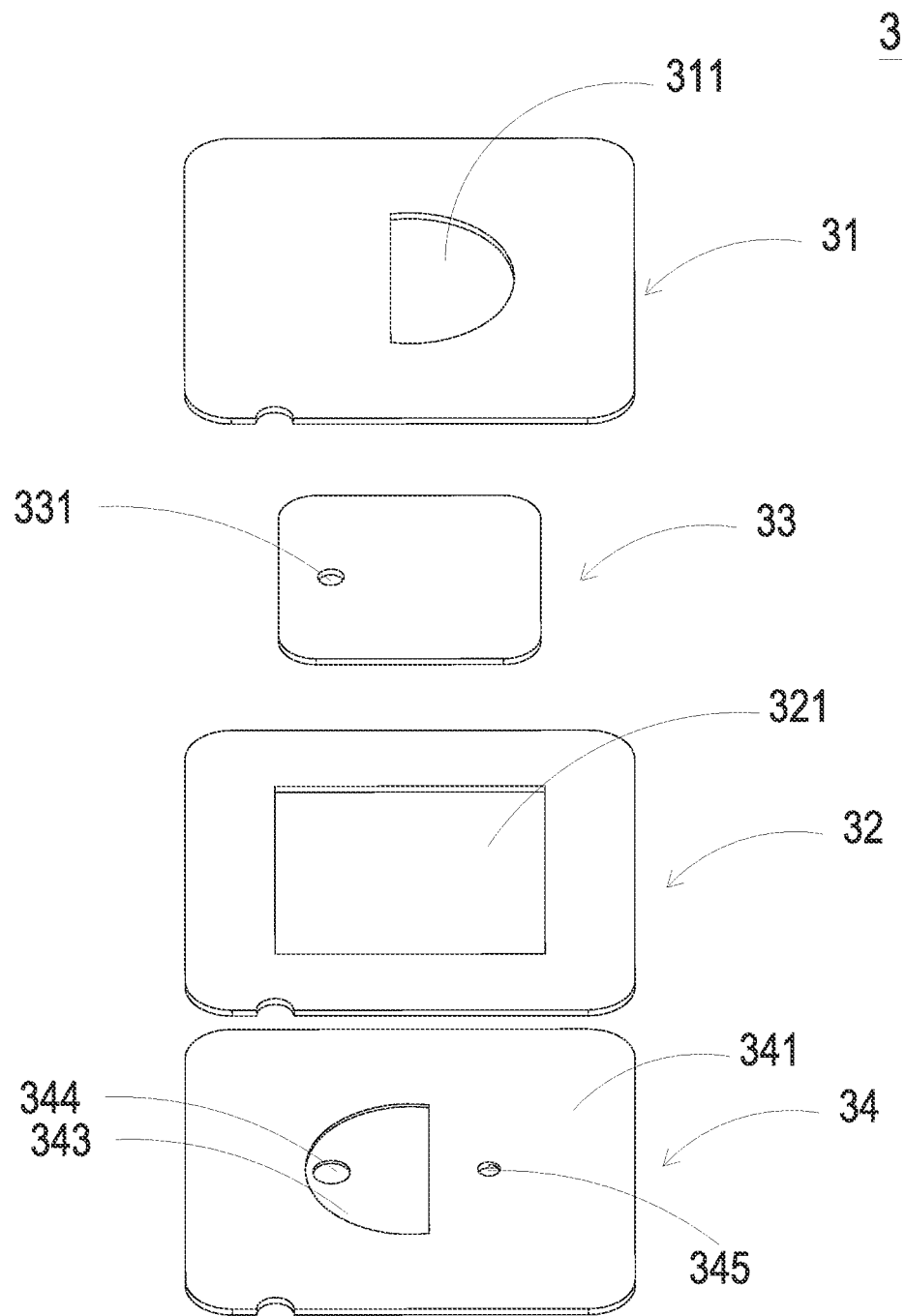
FIG. 5A illustrates a front exploded view of a thin valve structure according to the exemplary embodiment of the present disclosure.
Figure 5B:
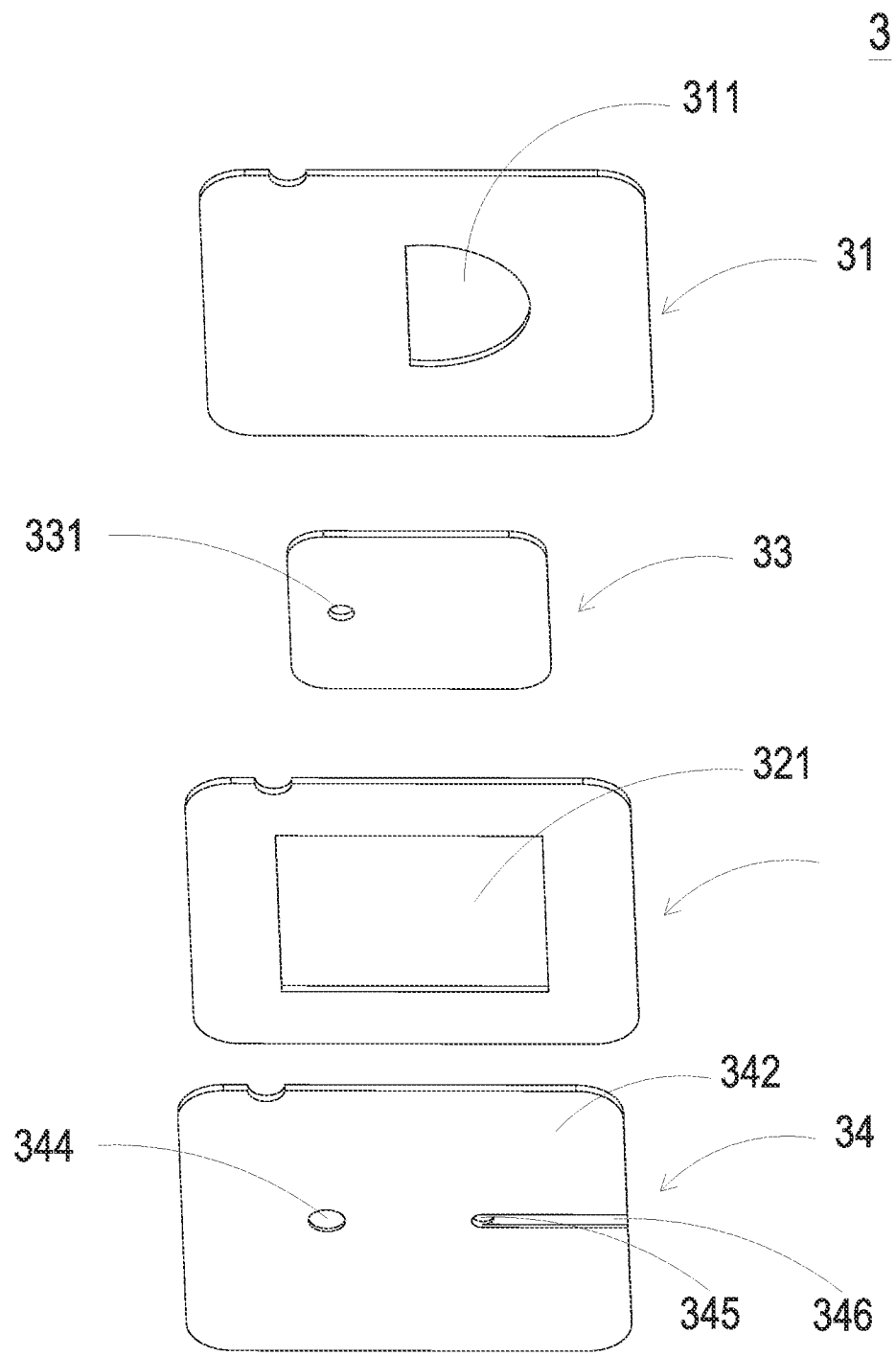
FIG. 5B illustrates a rear exploded view of the thin valve structure according to the exemplary embodiment of the present disclosure.

The thin gas transportation device 2 of one or some embodiments of the present disclosure has a valve structure. The valve structure may be a thin valve structure 3. Please refer to FIG. 5A and FIG. 5B. FIG. 5A illustrates a front exploded view of the thin valve structure 3. FIG. 5B illustrates a rear exploded view of the thin valve structure 3. The thin valve structure 3 includes a first thin plate 31, a valve frame 32, a valve sheet 33, and a second thin plate 34.

The first thin plate 31 has a hollowed-out area 311. The valve frame 32 has a valve sheet accommodation area 321. The valve sheet 33 is disposed in the valve sheet accommodation area 321 and has a valve hole 331. The valve hole 331 is misaligned with hollowed-out area 311. The shape of the valve sheet accommodation area 321 is the same as the shape of the valve sheet 33, thereby positioning and fixing the valve sheet 33.

The second thin plate 34 has a ventilation surface 341, a pressure relief surface 342, a ventilation groove 343, a ventilation hole 344, a pressure relief hole 345, and a pressure relief channel 346. The ventilation surface 341 and the pressure relief surface 342 are two surfaces opposite to each other. The ventilation groove 343 is recessed from the ventilation surface 341, and the ventilation groove 343 is misaligned with the hollowed-out area 311 of the first thin plate 31. The ventilation hole 344 is disposed in the ventilation groove 343 and is hollowed out from the ventilation groove 343 to the pressure relief surface 342, and the ventilation hole 344 locates correspondingly to the valve hole 331 of the valve sheet 33. Moreover, a diameter of the ventilation hole 344 is greater than a diameter of the valve hole 331. The pressure relief hole 345 and the ventilation groove 343 are spaced apart with each other. The pressure relief channel 346 is recessed from the pressure relief surface 342. One end of the pressure relief channel 346 is in fluid communication with the pressure relief hole 345, and the other end of the pressure relief channel 346 extends to an edge of the second thin plate 34. The shape of the ventilation groove 343 of the second thin plate 34 may be the same as the shape of the hallowed-out area 311 of the first thin plate 31, and they may be symmetry to each other.

The above-mentioned first thin plate 31, the valve frame 32, and the second sheet 34 may be all made of a metal. In some embodiments, they may be made of the same metal such as stainless steel. In addition, the thickness of the first thin plate 31, the thickness of the valve frame 32, and the thickness of the second thin plate 34 may be the same. For example, the thickness may be all 2 mm.

Figure 6A:
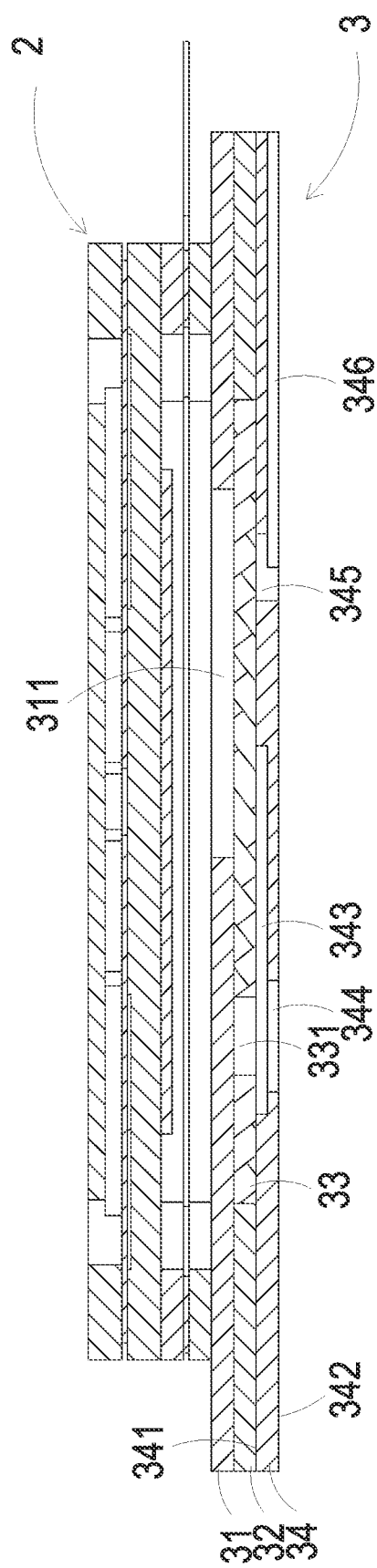
FIG. 6A illustrates a schematic cross-sectional view of the thin gas transportation device and the thin valve structure according to the exemplary embodiment of the present disclosure.
Figure 6B:
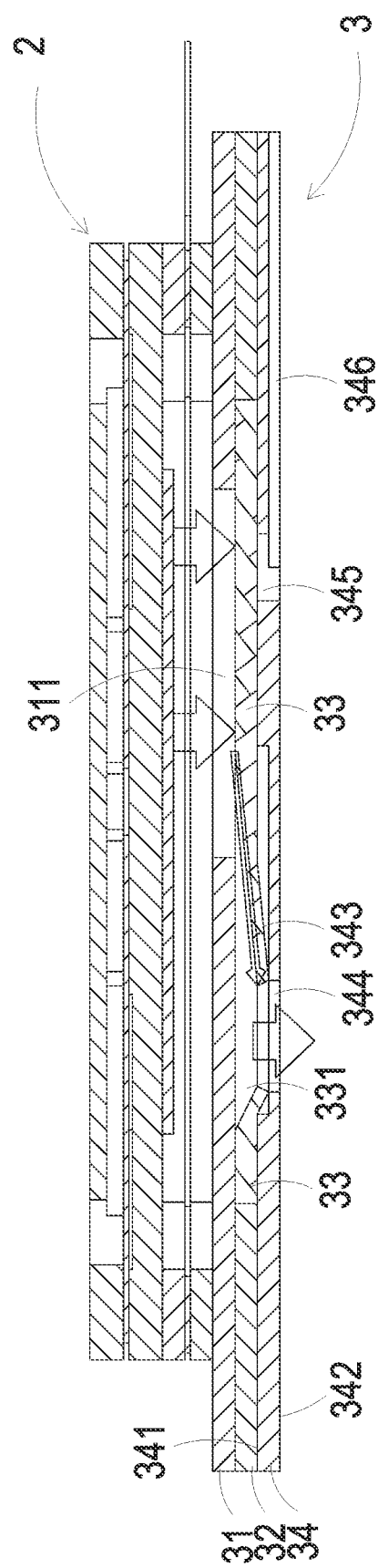
FIG. 6B illustrates a schematic cross-sectional view of the thin gas transportation device and the thin valve structure according to the exemplary embodiment of the present disclosure during the discharge process.
Figure 6C:
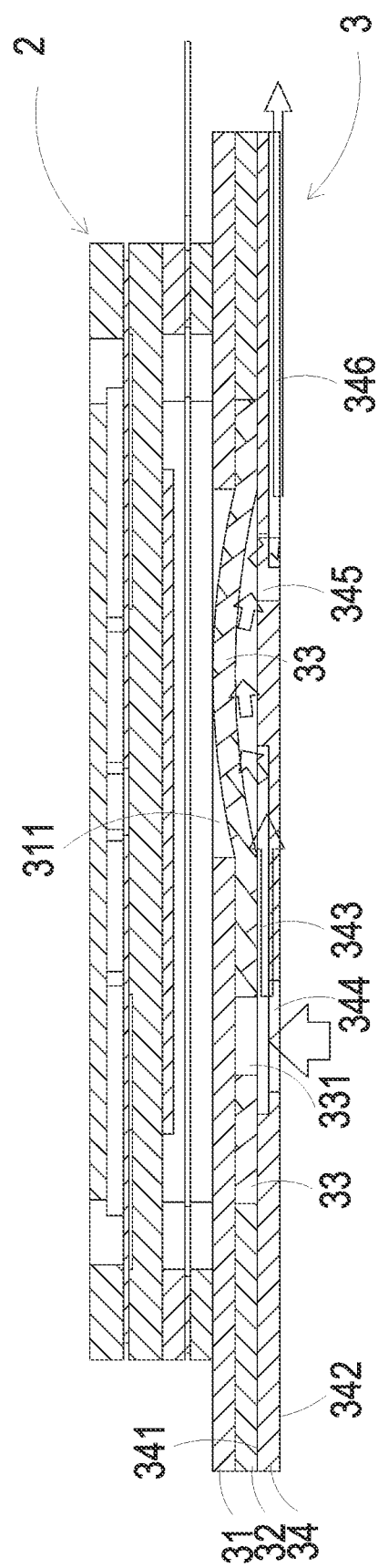
FIG. 6C illustrates a schematic cross-sectional view of the thin gas transportation device and the thin valve structure according to the exemplary embodiment of the present disclosure during the pressure relief process.

Please refer to FIG. 6A. FIG. 6A illustrates a schematic cross-sectional view of the thin gas transportation device 2. The first thin plate 31, the valve frame 32, and the second thin plate 34 are sequentially stacked and assembled with each other. The valve sheet 33 is disposed in the valve sheet accommodation area 321 of the valve frame 32. The thin gas transportation device 2 is stacked on the thin valve structure 3. When the thin gas transportation device 2 transports gas to the thin valve structure 3, as shown in FIG. 6B, the gas enters into the hollowed-out area 311 of the first thin plate 31 and pushes the valve sheet 33 to move. At the same time, a portion of the valve sheet 33 that above the ventilation groove 343 is pushed downwardly, so that the gas enters into the ventilation groove 343, and then is discharged out through the valve hole 331 and the ventilation hole 344 of the second thin plate 34. FIG. 6C illustrates a schematic cross-sectional view of the thin gas transportation device 2 and the thin valve structure 3 during the pressure relief process. When the thin gas transportation device 2 stops transporting gas and the pressure inside the thin valve structure 3 is lower than the external pressure, the device begins the pressure relief process. As shown in FIG. 6C, in the pressure relief process, the gas is guided from the ventilation hole 344 to the second thin plate 34, and simultaneously pushes the valve sheet 33 to move upwardly. At the same time, the valve hole 331 of the valve sheet 33 abuts against the first thin plate 31, so that the valve hole 331 is sealed. A portion of the valve sheet 33 located in the hollowed-out area 311 of the first thin plate 31 will be pushed upwardly, and the gas enters into the hollowed-out area 311 through the ventilation groove 343. The gas then further enters into the pressure relief channel 346 through the pressure relief hole 345, and thus is discharged out. Therefore, the gas relief process is completed.

To sum up, the thin gas transportation device of the present disclosure provided one or some embodiment has an elastic conductive pin pressing against the piezoelectric sheet, so as to contact and form an electrical connection with the piezoelectric sheet, and omit the soldering process, thereby simplifying the manufacturing process of the thin gas transportation device of the present invention. Moreover, since the piezoelectric sheet is contacted with the strip-shaped bent portion of the elastic conductive pin, the contact area can be increased, and thus the resistance between the bent portion and the piezoelectric sheet can be reduced. Furthermore, by using the bent portion with a curved surface to contact to the piezoelectric sheet, can avoid the burrs or the sharp corner at the end of the elastic conductive pin contacting the piezoelectric sheet, thereby preventing from problems such as faster abrasion, noise production, and the concern about lifespan reduction. In addition, such configuration can also prevent initiating an electric arc at the interface as well. Therefore, the thin gas transportation device fulfill the requirement of industrial applicability and inventive steps.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A thin gas transportation device, comprising:
an inlet plate having:
a first surface;
a second surface opposite to the first surface;
a plurality of inlet holes respectively penetrating from the first surface to the second surface;
a convergence chamber recessed from the second surface, wherein the convergence chamber is located at a center portion of the second surface; and
a plurality of inlet channels recessed from the second surface, wherein one end of each of the plurality of inlet channels is connected to a corresponding inlet hole of the plurality of inlet holes, and the other end of each of the plurality of inlet channels is connected to the convergence chamber;
a resonance sheet attached to the second surface, wherein the resonance sheet has:
a central perforation disposed at a center portion of the resonance sheet;
a vibration portion disposed around the central perforation and corresponds to the convergence chamber; and
a fixed portion disposed around a periphery of the vibration portion, wherein the resonance sheet is attached to the inlet plate through the fixed portion;
an actuating element attached to the fixed portion of the resonance sheet;
a first insulation frame attached to the actuating element;
a conductive frame, having:
a conductive outer frame attached to the first insulation frame;
an elastic conductive pin, wherein one end of the elastic conductive pin is connected to an inner edge portion of the conductive outer frame, and the other end of the elastic conductive pin extends obliquely toward the actuating element and forms a bent portion, wherein the bent portion presses against the actuating element and is electrically connected to the actuating element, and wherein the bent portion is strip-shaped; and
a conductive piece connected to an outer edge portion of the conductive outer frame; and
a second insulation frame attached to the conductive frame;
and wherein the thin gas transportation device further comprises a thin valve structure attached to the second insulation frame, wherein the thin valve structure has:
a first thin plate having a hollowed-out area;
a valve frame having a valve sheet accommodation area;
a valve sheet disposed in the valve sheet accommodation area, wherein the valve sheet has a valve hole, and the valve hole is misaligned with the hollowed-out area; and
a second thin plate, having:
a ventilation surface;
a pressure relief surface opposite to the ventilation surface;
a ventilation groove recessed from the ventilation surface, wherein the ventilation groove is misaligned with the hollowed-out area of the first thin plate;
a ventilation hole disposed in the ventilation groove and hollowed out from the ventilation groove to the pressure relief surface, wherein the ventilation hole locates correspondingly to the valve hole;
a pressure relief hole, wherein the pressure relief hole and the ventilation groove are spaced apart with each other; and
a pressure relief channel recessed from the pressure relief surface, wherein one end of the pressure relief channel extends to an edge of the second thin plate, and the other end of the pressure relief channel is in communication with the pressure relief hole.

2. The thin gas transportation device according to claim 1, wherein a width of the elastic conductive pin gradually shrinks from the inner edge portion of the conductive outer frame where the elastic conductive pin is connected to the bent portion.

3. The thin gas transportation device according to claim 1, wherein the bent portion is higher than the conductive outer frame by an abutting distance.

4. The thin gas transportation device according to claim 3, wherein the abutting distance is between 0.05 mm and 0.5 mm.

5. The thin gas transportation device according to claim 1, wherein a conductive coating material is disposed between the elastic conductive pin and the actuating element.

6. The thin gas transportation device according to claim 1, wherein the actuating element comprises:
- a vibration plate having a square shape;
- a frame disposed around the vibration plate;
- a plurality of connection portions respectively connected between the vibration plate and the frame to provide a flexible support for the vibration plate; and
- a piezoelectric sheet, wherein a shape and an area of the piezoelectric sheet are corresponding to a shape and an area of the vibration plate, the piezoelectric sheet is attached to the vibration plate, and the piezoelectric sheet presses against the bent portion so as to form an electrical connection between the piezoelectric sheet and the bent portion.

7. The thin gas transportation device according to claim 1, wherein the first thin plate, the valve frame, and the second thin plate are sequentially stacked and assembled with each other.

8. The thin gas transportation device according to claim 1, wherein a diameter of the ventilation hole is greater than a diameter of the valve hole.

9. The thin gas transportation device according to claim 1, wherein the first thin plate, the valve frame, and the second thin plate are all made of a metal.

10. The thin gas transportation device according to claim 9, wherein the metal material is stainless steel.

11. The thin gas transportation device according to claim 1, wherein the shape of the hollowed-out area is the same as the shape of the ventilation groove.

12. The thin gas transportation device according to claim 1, wherein the thickness of the first thin plate, the thickness of the valve frame, and the thickness of the second thin plate are the same.

13. The thin gas transportation device according to claim 12, wherein the thickness of the first thin plate, the thickness of the valve frame, and the thickness of the second thin plate are all 2 mm.

14. The thin gas transportation device according to claim 7, wherein the thickness of the first thin plate, the thickness of the valve frame, and the thickness of the second thin plate are the same.

15. The thin gas transportation device according to claim 14, wherein the thickness of the first thin plate, the thickness of the valve frame, and the thickness of the second thin plate are all 2 mm.

16. The thin gas transportation device according to claim 8, wherein the thickness of the first thin plate, the thickness of the valve frame, and the thickness of the second thin plate are the same.

17. The thin gas transportation device according to claim 16, wherein the thickness of the first thin plate, the thickness of the valve frame, and the thickness of the second thin plate are all 2 mm.

18. The thin gas transportation device according to claim 9, wherein the thickness of the first thin plate, the thickness of the valve frame, and the thickness of the second thin plate are the same.

19. The thin gas transportation device according to claim 18, wherein the thickness of the first thin plate, the thickness of the valve frame, and the thickness of the second thin plate are all 2 mm.

20. The thin gas transportation device according to claim 10, wherein the thickness of the first thin plate, the thickness of the valve frame, and the thickness of the second thin plate are the same.

21. The thin gas transportation device according to claim 20, wherein the thickness of the first thin plate, the thickness of the valve frame, and the thickness of the second thin plate are all 2 mm.

* * * * *